(12) United States Patent (10) Patent No.: US 11,807,947 B2
Shpaisman et al. (45) Date of Patent: *Nov. 7, 2023

(54) METHODS FOR PRODUCING AN ETCH RESIST PATTERN ON A METALLIC SURFACE

(71) Applicant: Kateeva, Inc., Newark, CA (US)

(72) Inventors: Nava Shpaisman, Kedumim (IL); Moshe Frenkel, Jerusalem (IL)

(73) Assignee: Kateeva, Inc., Newark, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 17/647,756

(22) Filed: Jan. 12, 2022

(65) Prior Publication Data

US 2022/0136113 A1 May 5, 2022

Related U.S. Application Data

(63) Continuation of application No. 16/948,597, filed on Sep. 24, 2020, now Pat. No. 11,255,018, which is a
(Continued)

(51) Int. Cl.
*C23F 1/02* (2006.01)
*C09D 11/101* (2014.01)
(Continued)

(52) U.S. Cl.
CPC ............. *C23F 1/02* (2013.01); *B41M 5/0058* (2013.01); *C09D 11/101* (2013.01); *C09D 11/30* (2013.01);
(Continued)

(58) Field of Classification Search
None
See application file for complete search history.

(56) References Cited

U.S. PATENT DOCUMENTS

| 4,015,706 A | 4/1977 | Goffredo et al. |
| 4,127,438 A | 11/1978 | Babcock et al. |

(Continued)

FOREIGN PATENT DOCUMENTS

| CN | 1440466 A | 9/2003 |
| CN | 1659310 A | 8/2005 |

(Continued)

OTHER PUBLICATIONS

JP Office Action dated Dec. 24, 2021 to JP Patent Application No. 2019-531090.
(Continued)

*Primary Examiner* — Jiong-Ping Lu
(74) *Attorney, Agent, or Firm* — Hauptman Ham, LLP

(57) ABSTRACT

A method of forming a metallic pattern on a substrate is provided. The method includes applying onto a metallic surface, a chemically surface-activating solution having an activating agent that chemically activates the metallic surface; non-impact printing an etch-resist ink on the activated surface to produce an etch resist mask according to a predetermined pattern, wherein at least one ink component within the etch-resist ink undergoes a chemical reaction with the activated metallic surface to immobilize droplets of the etch-resist ink when hitting the activated surface; performing an etching process to remove unmasked metallic portions that are not covered with the etch resist mask; and removing the etch-resist mask.

20 Claims, 2 Drawing Sheets

Related U.S. Application Data continuation of application No. 15/751,866, filed as application No. PCT/IL2016/050820 on Jul. 27, 2016, now Pat. No. 10,806,035.

(60) Provisional application No. 62/204,508, filed on Aug. 13, 2015.

(51) Int. Cl.
| | |
|---|---|
| *B41M 5/00* | (2006.01) |
| *G03F 7/20* | (2006.01) |
| *H05K 3/00* | (2006.01) |
| *G03F 1/50* | (2012.01) |
| *H10K 71/13* | (2023.01) |
| *H05K 3/06* | (2006.01) |
| *C09D 11/30* | (2014.01) |
| *C23F 1/00* | (2006.01) |

(52) U.S. Cl.
CPC .............. *C23F 1/00* (2013.01); *G03F 1/50* (2013.01); *G03F 7/2018* (2013.01); *H05K 3/0002* (2013.01); *H05K 3/0017* (2013.01); *H05K 3/0079* (2013.01); *H05K 3/061* (2013.01); *H10K 71/13* (2023.02); *H10K 71/135* (2023.02); *H05K 2203/013* (2013.01); *H05K 2203/0392* (2013.01); *H05K 2203/0582* (2013.01); *H05K 2203/1173* (2013.01)

(56) References Cited

U.S. PATENT DOCUMENTS

| | | | |
|---|---|---|---|
| 4,604,314 A | 8/1986 | Gentzkow et al. | |
| 4,756,994 A | 7/1988 | Araki et al. | |
| 4,946,711 A | 8/1990 | Hawker et al. | |
| 5,055,374 A | 10/1991 | Seio et al. | |
| 5,376,503 A | 12/1994 | Audett et al. | |
| 6,066,197 A | 5/2000 | Bristol et al. | |
| 6,218,074 B1 | 4/2001 | Dueber et al. | |
| 6,222,136 B1 | 4/2001 | Appelt et al. | |
| 6,399,273 B1 | 6/2002 | Yamada et al. | |
| 6,579,660 B1 | 6/2003 | Figov | |
| 6,858,352 B1 | 2/2005 | Band | |
| 6,860,925 B2 | 3/2005 | Soutar et al. | |
| 7,147,765 B2 | 12/2006 | Klocke et al. | |
| 8,421,215 B2 | 4/2013 | Tani et al. | |
| 10,398,034 B2 | 8/2019 | Shpaisman et al. | |
| 10,743,420 B2 | 8/2020 | Frenkel et al. | |
| 10,806,035 B2 * | 10/2020 | Shpaisman ............ | H05K 3/061 |
| 11,006,528 B2 | 5/2021 | Shpaisman et al. | |
| 11,255,018 B2 * | 2/2022 | Shpaisman ............... | C23F 1/00 |
| 2003/0164466 A1 | 9/2003 | Hauf et al. | |
| 2003/0177639 A1 | 9/2003 | Berg | |
| 2004/0023120 A1 | 2/2004 | Nishikubo et al. | |
| 2004/0079729 A1 | 4/2004 | Chen et al. | |
| 2004/0245213 A1 | 12/2004 | Fukase et al. | |
| 2005/0227492 A1 | 10/2005 | Hah et al. | |
| 2005/0250052 A1 | 11/2005 | Nguyen | |
| 2006/0020788 A1 | 1/2006 | Han et al. | |
| 2006/0049129 A1 | 3/2006 | Hopper et al. | |
| 2006/0060563 A1 * | 3/2006 | Kim ....................... | B82Y 10/00 216/41 |
| 2006/0199394 A1 | 9/2006 | Takahashi et al. | |
| 2008/0245768 A1 | 10/2008 | Cottrell et al. | |
| 2008/0308003 A1 | 12/2008 | Krol et al. | |
| 2009/0116401 A1 | 5/2009 | Ginzburg et al. | |
| 2009/0163615 A1 | 6/2009 | Halahmi et al. | |
| 2009/0188706 A1 | 7/2009 | Endo | |
| 2009/0278904 A1 | 11/2009 | Oh et al. | |
| 2012/0045583 A1 | 2/2012 | Frenkel et al. | |
| 2012/0288683 A1 | 11/2012 | Kuo et al. | |
| 2013/0298398 A1 | 11/2013 | Miyasaka et al. | |
| 2013/0334036 A1 | 12/2013 | Keigler et al. | |
| 2014/0141169 A1 | 5/2014 | Tuelsmann et al. | |
| 2014/0252571 A1 | 9/2014 | Khandekar et al. |
| 2014/0290520 A1 | 10/2014 | Frenkel et al. |
| 2014/0363632 A1 | 12/2014 | Smet et al. |
| 2015/0159124 A1 | 6/2015 | Takahashi et al. |
| 2015/0267305 A1 | 9/2015 | Choi et al. |
| 2017/0264066 A1 | 9/2017 | Oki et al. |
| 2018/0146556 A1 | 5/2018 | Frenkel et al. |
| 2018/0192521 A1 | 7/2018 | Shpaisman et al. |
| 2018/0242457 A1 | 8/2018 | Shpaisman et al. |
| 2019/0335589 A1 | 10/2019 | Shpaisman et al. |
| 2020/0396842 A1 | 12/2020 | Frenkel et al. |
| 2021/0007225 A1 | 1/2021 | Shpaisman et al. |

FOREIGN PATENT DOCUMENTS

| | | |
|---|---|---|
| CN | 1925724 A | 3/2007 |
| CN | 101023395 A | 8/2007 |
| CN | 1899003 B | 12/2010 |
| CN | 104011265 A | 8/2014 |
| EP | 1125760 B1 | 5/2006 |
| JP | 2002245794 A | 8/2002 |
| JP | 2003012971 A | 1/2003 |
| JP | 2005033049 A | 2/2005 |
| JP | 2005079479 A | 3/2005 |
| JP | 2007507616 A | 3/2007 |
| JP | 2007250884 A | 9/2007 |
| JP | 2009059777 A | 3/2009 |
| JP | 2009522205 A | 6/2009 |
| JP | 2009532205 A | 9/2009 |
| JP | 2009272609 A | 11/2009 |
| JP | 2011171323 A | 9/2011 |
| JP | 2011243256 A | 12/2011 |
| JP | 2013162007 A | 8/2013 |
| JP | 2015129342 A | 7/2015 |
| KR | 1020090117253 A | 11/2009 |
| KR | 1020150109932 A | 10/2015 |
| TW | 201534756 A | 9/2015 |
| WO | 2003081966 A2 | 10/2003 |
| WO | 2009116401 A1 | 9/2009 |
| WO | 2016185215 A1 | 11/2016 |
| WO | 2016193978 A2 | 12/2016 |
| WO | 2017025949 A1 | 2/2017 |

OTHER PUBLICATIONS

Non-Final Office Action dated Mar. 1, 2022 for U.S. Appl. No. 16/912,818.
Third Office Action dated Apr. 1, 2022 for CN Patent Application No. 201780086295.
Notice of Allowance dated Apr. 14, 2022 for U.S. Appl. No. 17/301,459.
Notice of Final Rejection dated Apr. 14, 2022 for KR Patent Application No. 10-2019-7016384.
Office Action dated Oct. 13, 2022 for KR Patent Application No. 10-2017-7037881.
CN Office Action dated Jan. 25, 2021 for CN Patent Application No. 201780086295.
CN Office Action dated Jul. 2, 2020 for CN Patent Application No. 201680038043.6.
CN Second Office Action dated May 12, 2021 for Application No. 201680048035.X.
Decision of Refusal dated Jan. 26, 2021 in JP Patent Application No. 2018-515364.
Extended EP Search dated Feb. 27, 2019 to EP Patent Application No. 16834759.9.
Extended EP Search Report dated Aug. 31, 2021 in EP Patent Application No. 21166748.0.
Extended EP Search Report dated Aug. 4, 2020 in EP Patent Application No. 17880261.7.
Extended EP Search Report dated Jan. 3, 2019, to EP Patent Application 16802692.0.
Final Notice of Reasons for Refusal dated Jan. 26, 2021 in JP Patent Application No. 2019-092613.
Final Office Action dated Jul. 7, 2021 for U.S. Appl. No. 16/912,818.
Final Office Action dated Feb. 11, 2019 for U.S. Appl. No. 15/751,866.

(56) References Cited

OTHER PUBLICATIONS

First Office Action dated Oct. 30, 2020 in CN Patent Application No. 201680048035X.
International Search Report and Written Opinion dated Apr. 9, 2018 to PCT Application No. PCT/IL17/51338.
International Search report and Written Opinion dated Jan. 6, 2017, to PCT Application No. PCT/IL2016/50820.
International Search Report and Written Opinion dated Nov. 17, 2016, to PCT Application No. PCT/IL16/50567.
JP Decision of Refusal dated Mar. 26, 2021 for JP Patent Application No. 2018-507595.
JP Decision of Refusal dated Feb. 8, 2021 for JP Patent Application No. 2018-515364.
JP Final Notice of Reason of Refusal dated Feb. 8, 2021 for JP Patent Application No. 2019-092613.
JP Office Action dated Dec. 24, 2021 for JP Patent Application No. 2019-531090.
JP Office Action dated Jun. 5, 2020 for JP Patent Application No. 2018-515364.
KR Notification of Reason for Refusal dated Oct. 7, 2021 for Application No. 10-2019-7016384.
Non Final Office Action dated Jul. 20, 2020 to U.S. Appl. No. 16/507,358.
Non Final Office Action dated Oct. 21, 2019 for U.S. Appl. No. 15/578,300.
Non Final Office Action dated Oct. 9, 2019 to U.S. Appl. No. 15/751,866.
Non-Final Office Action dated May 18, 2021 for U.S. Appl. No. 16/912,818.
Non-Final Office Action dated Aug. 11, 2021 in U.S. Appl. No. 16/948,597.
Non-Final Office action dated Sep. 28, 2018 to U.S. Appl. No. 15/751,866.
Non-Final Office Action dated Sep. 27, 2021 in U.S. Appl. No. 16/912,818.
Notice of Allowance dated Jan. 8, 2021 to U.S. Appl. No. 15/507,358.
Notice of Allowance dated Mar. 31, 2020 to U.S. Appl. No. 15/578,300.
Notice of Allowance dated Oct. 20, 2021 for U.S. Appl. No. 16/948,597.
Notice of First Office Action dated Jan. 25, 2021 in CN Patent Application No. 201780086295.0.
Notice of Reasons for Refusal dated Jul. 17, 2020 in JP Patent Application No. 20185075595.
Office Action dated Jun. 17, 2021 in TW Patent Application No. 106143295.
Quan et al. "Adsorption Behaviour of Schiff Base and Corrosion Protection of Resulting Films to Copper Substrate," Corrosion Science, vol. 44, pp. 703-715, Jun. 6, 2000.
Second Office Action dated Sep. 1, 2021 for CN Patent Application No. 201780086295.0.

* cited by examiner

METHODS FOR PRODUCING AN ETCH RESIST PATTERN ON A METALLIC SURFACE

CROSS-REFERENCE TO RELATED APPLICATIONS

This application is a continuation of U.S. patent application Ser. No. 16/948,597, filed Sep. 24, 2020, which is a continuation of U.S. Pat. No. 10,806,035, issued Oct. 13, 2020, which is a 371 of International Patent Application No. PCT/IL2016/050820, filed on Jul. 27, 2016, which claims benefit from U.S. Provisional Patent Application No. 62/204,508, filed on Aug. 13, 2015, all of which are hereby incorporated by reference.

FIELD OF THE INVENTION

Embodiments of the invention relates to manufacturing of printed circuit boards by applying the etch-resist mask using nonimpact orienting, such as, inkjet printing.

BACKGROUND

Printed circuit boards (PCBs) are widely used in most electronic products. The manufacturing of PCBs is considered cheaper, faster and more accurate than using other wiring methods such as point-to-point construction. Still, there is an ongoing search for simpler and more cost-effective manufacturing processes that would maintain high quality and would enable to produce PCBs according to specific requirements including the manufacturing of cost-effective small batches, larger batches with high throughout, on-demand boards, boards with denser circuits, boards with thinner lines and others.

The patterning of copper lines in the manufacturing process of a PCB is usually done by applying an etch-resist photo-mask on a copper layer laminated to an insulating material board and removing exposed copper portions by an etching process, leaving only the desired copper lines (also refer to as image patterning) as the electrically conducting paths. The etch-resist pattern can be applied on top of the copper layer by additive methods, for example, by non-impact printing (e.g., inkjet printing) on top of the copper layer. Conventional inkjet materials having relatively low viscosity and accordingly when ink drops would hit a non-absorbing surface, such as a copper surface, uncontrolled spreading of the drops and other phenomena such as clustering, coalescence and extensive dot gain usually occur. Accordingly, the printed pattern, which is formed by inkjet printing technology, may exhibit poor quality or the copper lines including, for example, lack of details, inconsistent line width, poor line edge smoothness, shorts between adjacent lines and disconnection of pattern lines.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
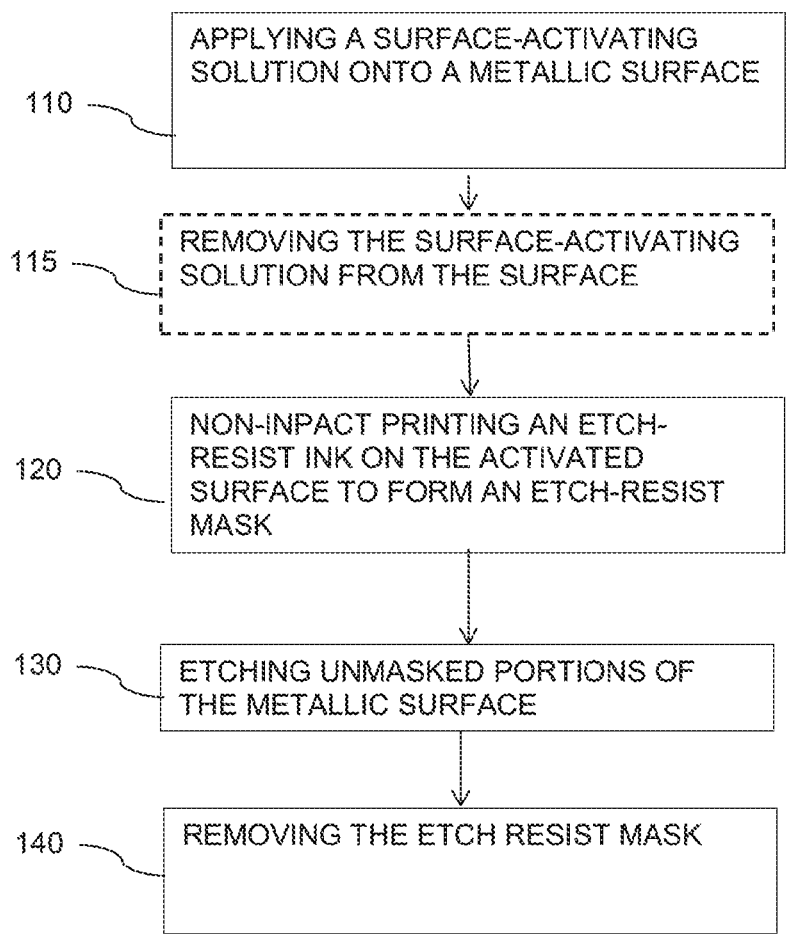
FIG. 1 is flowchart of a method for producing an etch-resist mask according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

SUMMARY

Embodiments of the invention include methods of forming a metallic pattern on a substrate. The method may include applying onto a metallic surface coupled to the substrate, a chemically surface-activating solution having an activating agent that chemically activates the metallic surface; non-impact printing an etch-resist ink on the activated surface to produce an etch resist mask according to a predetermined pattern, wherein at least one ink component within the etch-resist ink undergoes a chemical reaction with the activated metallic surface to immobilize droplets of the etch-resist ink when hitting the activated surface; performing an etching process to remove unmasked metallic portions that are not covered with the etch resist mask; and removing the etch resist mask.

In some embodiments, the metallic pattern formed according to embodiments of the inventions includes pattern lines having a width of less than 50 microns. In some embodiments, the etch resist masked produced according to embodiments of the invention includes lines having a width of less than 50 microns. In some embodiments, the metallic pattern formed according to embodiments of the inventions includes pattern lines having a width of less than 30 microns. In some embodiments, the etch resist masked produced according to embodiments of the invention includes lines having a width of less than 30 microns.

In some embodiment, the method may include, prior to printing, removing the chemically surface-activating solution from the surface using a solvent. In some embodiments, the ink component that undergoes the chemical reaction is an anionic component. In some embodiments, the ink component that undergoes the chemical reaction with the activated surface is a polymeric component selected from an acrylate, a phosphate, a sulfonate or a mixture thereof. In some embodiments, the activating agent may comprise at least one of copper salts, ferric salts, chromic-sulfuric acids, persulfate salts, sodium chlorite and hydrogen peroxide or a mixture thereof.

In some embodiments, applying the chemically surface-activating solution comprises immersing the metallic surface into a bath containing the chemically surface-activating solution for about 10-60 seconds. In some embodiments, applying the chemically surface-activating solution comprises spraying the chemically surface-activating solution onto the metallic. In some embodiments, non-impact printing the etch-resist ink on the activated surface comprises ink-jet printing.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Embodiments of the invention are related to methods of forming or applying an etch-resist mask on a metallic layer by non-impact printing, for example, during the manufacturing of printed circuit boards (PCBs). A method of applying an etch-resist mask on a metallic surface according to embodiments of the invention may include applying a chemically surface-activating solution on top of a metallic surface to chemically activate the metallic surface, followed by removing/washing the chemically activating solution from the surface and printing (e.g. inkjet printing) an etch resist ink on top of the activated surface. According to embodiments of the invention, a reactive component of the etch-resist ink undergoes a chemical reaction with the activated surface to immobilize droplets of the liquid composition when hitting the surface. The chemical reaction may cause a significant increase in the ink droplet viscosity (for example, by one or two orders of magnitudes) instantaneously upon hitting the activated surface.

In some embodiments, the reactive component in the etch-resist ink (ink component) may be an etch resist component and in other embodiments the reactive component may be different from the etch-resist component. According to some embodiments, more than one reactive component of the etch resist-ink may undergo a chemical reaction with components on the activated surface.

The metallic layer may be a copper layer laminated onto an insulating non-conductive substrate. For ease of explanation, the description below refers to a copper surface. It should be realized that other metallic surfaces, such as, aluminum surfaces, stainless steel surfaces, gold surfaces and others are likewise applicable to embodiments of the invention.

Reference is made to FIG. 1, which is a flowchart of a method of producing an etch-resist mask according to some embodiments of the invention. According to embodiments of the invention, as illustrated in box 110, the method may include applying a chemically surface-activating solution onto a metallic surface, on which an etch-resist pattern is to be printed. In some embodiments, the chemically surface-activating solution may be or may include any etching solution capable to chemically activate the surface. A chemically activated surface may be defined as a surface which, prior to the surface activation, will not react with the etch resist ink materials while it does react post the surface activation to cause the immobilization of the etch resist ink droplet. The surface-activating solution may include, for example, copper salts, ferric salts, chromic-sulfuric acids, persulfate salts, sodium chlorite and hydrogen peroxide. In some embodiments, applying a chemically activating solution may include immersing the surface in a bath containing the chemically surface-activating solution, spraying the chemically surface-activating solution over the surface and any other suitable method. In some embodiments, the method may include subjecting the metallic surface to the chemically activating solution (e.g., by immersing, spraying or the like) for a predetermined amount of time, for example, for 10 seconds, 20 seconds, 30 seconds, 60 seconds or more.

As illustrated in box 115, in some embodiments, the method may include optionally, removing the chemically surface-activating solution using, for example, an alcoholic solution. For example, the method may include removing residues of the chemically surface-activating solution from the surface using ethanol. In some embodiments, removing the chemically activating solution from the surface may be done using liquids other than alcoholic solutions, for example; propyl alcohol; iso-propyl alcohol; acetone.

As illustrated in box 120, in some embodiments, the method may include non-impact printing (e.g., by inkjet printing) an etch-resist ink onto the activated surface to produce an etch resist mask according to a predetermined pattern. The etch resist ink may comprise an etch-resist polymeric component that undergoes a chemical reaction with the activated surface to immobilize droplets of the etch-resist ink when hitting the activated surface. In some embodiments, another ink component, different from the etch-resist component, undergoes a chemical reaction with the activated surface to immobilize droplets of the etch-resist ink when hitting the activated surface.

Non-limiting examples of etch resist polymeric reactive components may be acrylates, styrene acrylates, phosphates and sulfonates polymers, obtaining molecular weight (Mw) form 1000-17,000.

In some embodiments, the etch resist reactive polymeric component may be water-soluble and may include reactive anionic components. Non-limiting examples of anionic etch-resist reactive component may include at least one anionic polymer (in a base form) at pH higher than 7.0. The anionic polymer may be selected from acrylic resins and styrene-acrylic resins in their dissolved salt forms, sulphonic resins in their dissolved salt form, such as sodium, ammonium or amine neutralized form or the like. Without wishing to be bound by any specific theoretical mechanism, the aforementioned resins may undergo a reaction with the reactive (activated) surface. For example, the copper metal surface is activated to form copper cations on top of the copper and when an acrylic polymer (being in the etch-resist ink) would hit the surface, the anionic acrylate may react with the copper ions to form a polymeric matrix in the droplet, which would dramatically increase the droplet viscosity.

In some embodiments, the ink component that undergoes the chemical reaction with a surface-activated component to immobilize droplets of the etch-resist ink when hitting the activated surface may be different from the etch-resist component.

As illustrated in box 130, the masked copper board may further be etched by a metal etching (e.g., acidic copper etching) solution to remove exposed, unmasked portions of the metallic layer. As illustrated in box 140, the etch resist mask may then be removed to expose a line pattern on the substrate, i.e., an insulating board.

EXAMPLES

Using an Epson stylus 4900 inkjet printer, exemplary liquid compositions (etch-resist ink compositions as described herein) were printed on an FR4 copper clad board having a copper thickness of 18 micron. In some tests, the copper was first chemically activated by applying a chemically surface-activating solution to activate the copper surface. A liquid composition of an etch resist ink was selectively printed according to a predetermined pattern on top of either the activated or inactivated copper surface, using ink-jet printing technology. In the description below, % (w/w) is a measure of the concentration of a substance in terms of the percentage by weight relative to the weight of the composition. Copper from the unmasked exposed zones was etched away using an etchant bath containing a ferric chloride etchant solution of strength 42° Baume supplied by Amza (PERMIX 166). The etching was performed in a Spray Developer S31, supplied by Walter Lemmen GMBH, at a temperature of 35° C. for 3 minutes. The etch resist mask was stripped off by immersing the etched board in a 1% (w/w) aqueous solution of NaOH at a temperature of 25° C. followed by washing the FR4 copper board with water and drying by air at 25° C.

Example 1—An etch resist ink, which is in a form of a liquid composition at room temperature, was printed on top of an untreated (inactivated) copper FR4 board. The liquid composition was prepared with 10% propylene glycol (as a humectant) and 1% (w/w) 2-Amino-2-methyl propanol, 0.3% (w/w) of BYK 348 supplied by BYK and 2% (w/w) of Bayscript BA Cyan. These materials were dissolved in water containing 24% Joncryl 8085 styrene acrylic resin solution. Using an Epson stylus 4900 inkjet printer the etch resist composition was printed on top of an FR4 copper clad board having a copper thickness of 18 micron, to produce the etch-resist mask.

Figure 2A:
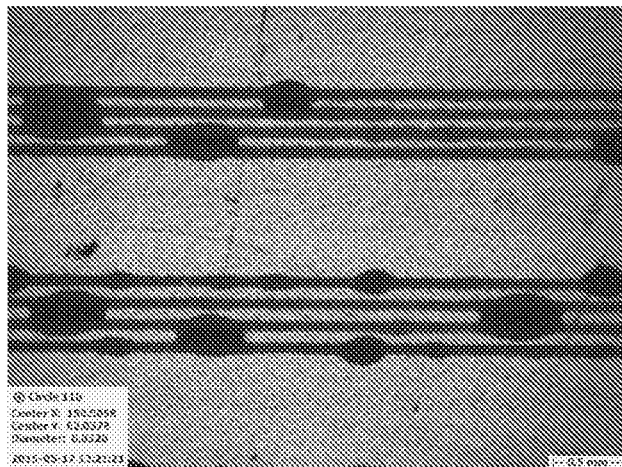
FIG. 2A shows a photograph of an exemplary etch resist mask printed on a non-activated copper.

The etch-resist mask was visually inspected. As can be shown in FIG. 2A, the printed pattern demonstrated very poor print quality with extremely poor edge definitions and severe shorts between the lines.

Example 2—The liquid composition was prepared as detailed in Example 1. FR4 copper clad board surface was activated by dipping (e.g., immersing) the copper clad into an aqueous solution of $CuCl_2$ 0.5% (w/w) for 30 seconds followed by washing the copper board with technical ethanol.

Figure 2B:
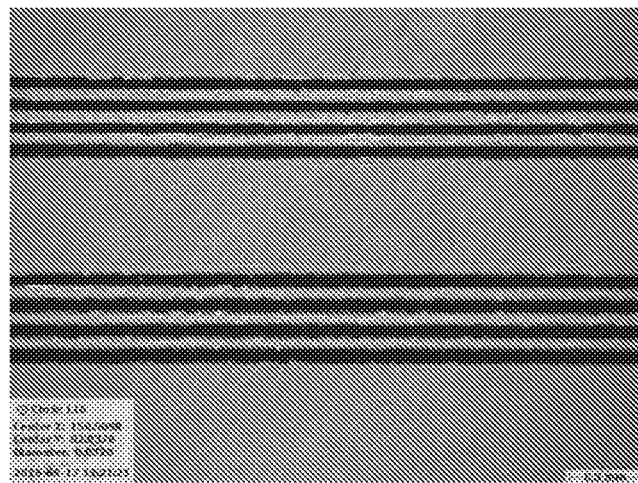
FIG. 2B shows photographs of an exemplary etch resist mask printed on an activated copper surface according to embodiments of the invention.

Using an Epson stylus 4900 inkjet printer, the liquid composition was printed on top of the treated copper board and dried at 80° C. to produce an insoluble etch resist mask. The etch resist pattern demonstrated a high print quality well-defined and thin lines width down to 50 micrometers contained sharp edges and no line breaks as can be shown in FIG. 2B. Etching of the exposed copper and removal of the etch resist mask were conducted as detailed in Example 1. The wiring pattern on the board demonstrated well-defined thin lines with a width down to 50 microns containing sharp edges and no line breaks.

Example 3—The liquid composition was prepared as detailed in Example 1. The copper surface was activated by dipping the FR4 copper clad board into a bath containing 20% aqueous solution of $FeCl_3$ (w/w) for 10 sec following by washing the copper board with technical ethanol.

Similarly to Example 2, the liquid composition was inkjet-printed on the coated copper board and dried at 80° C. to produce an insoluble etch resist mask. The etch resist pattern demonstrated a high print quality well-defined and thin lines down to 50 micron contained sharp edges and no line breaks. Etching of the exposed copper and removal of the etch resist mask were conducted as detailed in Example 1. The wiring pattern on the board demonstrated well-defined pattern with thin lines having a width of down to 30 micron sharp edges and no line breaks.

Example 4—The liquid composition was prepared as detailed in Example 1. The copper surface was activated by dipping the FR4 copper clad board into an aqueous solution of $Na_2S_2O_8$ 1% (w/w) for 30 sec following by washing the copper board with technical ethanol.

Using an Epson stylus 4900 inkjet printer, the etch resist liquid composition was printed on the treated copper board and dried at 80° C. to produce an insoluble etch resist mask. The etch resist pattern demonstrated a high print quality well-defined and thin lines down to 50 micrometers, contained sharp edges and no line breaks. The etching of the unmasked copper and removal of the etch resist mask were conducted as detailed in example 1. The wiring pattern produced by the etching and stripping processes demonstrated a well-defined pattern with thin lines having a width of down to 30 micron sharp edges and no line breaks.

Table 1 below lists some non-limiting examples of chemically surface-activating components used in embodiments of the invention, their relative weigh concentrations in the surface-activating solution and suggested immersing time according to some embodiments of the invention.

TABLE 1

| Activating agent | Concentration (w/w %) | immersing time (Seconds) |
|---|---|---|
| $CuCl_2$ (or any divalent copper salts) | 0.5-1 | 30 |
| $Na_2S_2O_8$ (or any persulfate salt) | 0.5-1 | 30 |
| $H_2O_2$ | 10 | 30 |
| $FeCl_3$ | 20 | 10 |
| $HCrO_4/H_2SO_4$ | 5 | 30 |
| $NaClO_2$ | 5 | 60 |

Table 2 below lists some non-limiting examples of etch-resist inks.

TABLE 2

| | Etch-resist ink | Etch-resist component |
|---|---|---|
| 1 | 2% (w/w) of Cyan dye, 10% propylene glycol, 1% (w/w) 2-Amino-2-methyl propanol and 0.3% (w/w) of surfactant were dissolved in water containing 24% styrene acrylic resin solution. | Acrylates polymers; Mw: 1000-17,000 |
| 2 | 2% (w/w) of Cyan dye, 10% propylene glycol, 1% (w/w) 2-Amino-2-methyl propanol and 0.3% (w/w) of surfactant were dissolved in water containing 24% phosphates resin solution. | Phosphates polymers Mw: 500-17,000 |
| 3 | 2% (w/w) of Cyan dye, 10% propylene glycol, 1% (w/w) 2-Amino-2-methyl propanol and 0.3% (w/w) of surfactant were dissolved in water containing 24% sulfonates resin solution. | Sulfonates polymers Mw: 500-17,000 |

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed:

1. A method of forming a metallic pattern on a substrate, the method comprising:
   chemically activating a metallic surface of a substrate to form metal ions;
   after chemically activating the metallic surface, selectively printing an etch-resist ink onto the metallic surface;
   reacting a component of the etch-resist ink with the ions to immobilize the etch-resist ink into an etch-resist mask on the metallic surface; and
   performing an etching process to remove portions of the metallic layer that are not covered by the etch-resist mask to form the metallic pattern.

2. The method of claim 1, wherein the metallic pattern has multiple metallic lines, each having a width of less than 50 microns.

3. The method of claim 1, wherein the etch-resist mask has lines having a width of less than 50 microns.

4. The method of claim 1, wherein the metallic pattern has metallic lines having a width of less than 30 microns.

5. The method of claim 1, further comprising, prior to printing, treating the activated surface of the metallic layer using a solvent.

6. The method of claim 1, wherein the component that reacts with the ions is a polymeric component comprising an acrylate, a phosphate, a sulfonate, or any combination thereof.

7. The method of claim 1, wherein chemically activating the metallic surface comprises treating the metallic surface using a material selected from the group consisting of a copper salt, a ferric salt, a chromic-sulfuric acid, a persulfate salt, sodium chlorite, and hydrogen peroxide.

8. The method of claim 1, wherein chemically activating the metallic surface comprises immersing the metallic surface in a bath of an aqueous solution for about 10-60 seconds or spraying the aqueous solution onto the metallic surface.

9. The method of claim 1, wherein selectively printing the etch-resist ink onto the metallic surface comprises ink-jet printing.

10. The method of claim 1, wherein the etch-resistant ink comprises a dye.

11. The method of claim 1, wherein the metallic surface comprises copper and the ions of the metallic surface comprise copper cations.

12. A method of forming a metallic pattern on a substrate, the method comprising:
    forming metal ions on a metallic surface of a substrate by applying an aqueous solution comprising an inorganic agent onto the metallic surface;
    ink-jet printing a reactive ink onto the metallic surface;
    reacting a component of the reactive ink with the ions to produce a resist;
    performing an etching process to remove portions of the metallic layer that are not covered by the resist; and
    removing the resist to form the metallic pattern.

13. The method of claim 12, wherein the metallic comprises metallic lines, each having a width of less than 50 microns.

14. The method of claim 12, wherein the reactive ink comprises an acrylate, a phosphate, a sulfonate, or any combination thereof.

15. The method of claim 12, wherein the inorganic agent comprises one or more materials selected from the group consisting of a copper salt, a ferric salt, a chromic-sulfuric acid, a persulfate salt, sodium chlorite, and hydrogen peroxide.

16. The method of claim 12, wherein the reactive ink further comprises a dye.

17. The method of claim 12, wherein the component of the reactive ink is a polymer.

18. A method of forming a pattern on a copper substrate, the method comprising:
    activating a copper surface of a substrate by applying an aqueous solution comprising an inorganic activating agent selected from the group consisting of a copper salt, a ferric salt, a chromic-sulfuric acid, a persulfate salt, sodium chlorite, and hydrogen peroxide onto the metallic surface;
    after chemically activating the copper surface, ink-jet printing an ink comprising an acrylate, a phosphate, a sulfonate, or a combination thereof onto the copper surface;
    reacting a component of the ink with copper ions of the copper surface to produce a resist;
    performing an etching process to remove portions of the copper surface that are not covered by the resist; and
    removing the resist to form the pattern on the copper surface.

19. The method of claim 18, wherein the pattern has copper lines having a width of less than 30 microns.

20. The method of claim 18, wherein the ink comprises a dye.

* * * * *